United States Patent
McAndrew et al.

(10) Patent No.: US 9,111,894 B2
(45) Date of Patent: Aug. 18, 2015

(54) MOFSET MISMATCH CHARACTERIZATION CIRCUIT

(75) Inventors: Colin C. McAndrew, Phoenix, AZ (US); Brandt Braswell, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 379 days.

(21) Appl. No.: 13/222,335

(22) Filed: Aug. 31, 2011

(65) Prior Publication Data
US 2013/0049788 A1  Feb. 28, 2013

(51) Int. Cl.
*H03K 17/687* (2006.01)
*H01L 21/66* (2006.01)
*H01L 27/092* (2006.01)

(52) U.S. Cl.
CPC ............... *H01L 22/34* (2013.01); *H01L 27/092* (2013.01); *H01L 2924/0002* (2013.01)

(58) Field of Classification Search
USPC ........................................................ 327/437
See application file for complete search history.

(56) References Cited

U.S. PATENT DOCUMENTS

| | | | |
|---|---|---|---|
| 3,952,185 A * | 4/1976 | Stultz et al. ................... 708/806 |
| 4,906,871 A | 3/1990 | Iida | |
| 4,980,580 A | 12/1990 | Ghoshal | |
| 5,041,741 A | 8/1991 | Steele | |
| 5,438,287 A | 8/1995 | Faue | |
| 5,598,111 A | 1/1997 | Enomoto | |
| 6,207,473 B1 | 3/2001 | Hirai et al. | |
| 6,522,323 B1 | 2/2003 | Sasaki et al. | |
| 7,002,241 B1 | 2/2006 | Mostafazadeh | |
| 7,129,566 B2 | 10/2006 | Uehling et al. | |
| 7,282,952 B2 * | 10/2007 | Oka ................................. 326/63 |
| 7,408,372 B2 | 8/2008 | Agarwal et al. | |
| 7,711,998 B2 * | 5/2010 | Foeste ........................... 714/721 |
| 7,818,137 B2 * | 10/2010 | Agarwal et al. ............... 702/117 |
| 2003/0127995 A1 | 7/2003 | Kramer et al. | |
| 2009/0206827 A1 | 8/2009 | Aimuta et al. | |
| 2009/0310430 A1 * | 12/2009 | Chuang et al. ............... 365/201 |
| 2010/0007404 A1 * | 1/2010 | Hwang ......................... 327/512 |
| 2010/0123483 A1 | 5/2010 | Chung et al. | |

OTHER PUBLICATIONS

Agarwal, K., et al., "Rapid Characterization of Threshold Voltage Fluctuation in MOS Devices", IEEE International Conference on Microelectronic Test Structures, Mar. 19-22, Tokyo, Japan, 2007, pp. 74-77.

Mukhopadhyay, S., et al., "Statistical Characterization and On-Chip Measurement Methods for Local Random Variability of a Process Using Sense-Amplifier-Based Test Structure", ISSCC, Session 22, Digital Circuit Innovations, 22.2, 2007, pp. 400-401.

Conti, M., et al., "A Modular Test Structure for CMOS Mismatch Characterization", IEEE ISCAS, 2003, pp. V-569-V-572.

Shimizu, Y., et al., "Test Structure for Precise Statistical Characteristics Measurement of MOSFETs", Proc. IEEE 2002 Int. Conference on Microelectronic Test Structures, vol. 15, Apr. 2002, pp. 49-54.

(Continued)

*Primary Examiner* — Lincoln Donovan
*Assistant Examiner* — Patrick Chen

(57) ABSTRACT

A semiconductor device comprises a plurality of transistor mismatch circuits formed on a semiconductor wafer; and a characterization circuit formed on the semiconductor wafer. The characterization circuit is coupled to receive input provided by the absolute value circuits simultaneously which themselves receive inputs from the mismatch circuits simultaneously and is configured to output a standard deviation of mismatch between transistors in the mismatch circuits.

20 Claims, 3 Drawing Sheets

(56) References Cited

OTHER PUBLICATIONS

Terada, K., et al., "A Test Circuit for Measuring MOSFET Threshold Voltage Mismatch", IEEE ICMTS 2003, pp. 03-227 thru 03-231.

U.S. Appl. No. 13/222,323, McAndrew, Colin C., filed Aug. 31, 2011, "MOSFET Mismatch Characterization Circuit", Office Action—Rejection, mailed Dec. 5, 2012.

U.S. Appl. No. 13/222,232, Inventor Colin C. McAndrew, "MOSFET Mismatch Characterization Circuit", filed Aug. 31, 2011, Office Action—Rejection, mailed Nov. 4, 2013.

U.S. Appl. No. 13/222,232, McAndrew, C.C., et al., "MOSFET Mismatch Characterization Circuit", Office Action—Final Rejection, mailed Jul. 9, 2013.

Office Action mailed Feb. 28, 2014 in U.S. Appl. No. 13/222,323.

* cited by examiner

MOFSET MISMATCH CHARACTERIZATION CIRCUIT

CROSS-REFERENCE TO RELATED APPLICATION(S)

This application is related to U.S. patent application Ser. No. 13/222,323, filed on even date, entitled "MOSFET MISMATCH CHARACTERIZATION CIRCUIT," naming Colin McAndrew and Michael Zunino as inventors, and assigned to the current assignee hereof.

BACKGROUND

1. Field

This disclosure relates generally to electronic circuits, and more specifically, to circuits for characterizing transistor mismatch.

2. Related Art

MOSFET mismatch is a leading cause of yield loss for analog circuits. Mismatch can vary over time in a manufacturing process, but characterization and on-going monitoring are difficult as they can, if the amount of mismatch is small, require precision and/or time-consuming measurements that are not available or are undesirable in a manufacturing environment.

Direct drain current mismatch measurements, including over bias and geometry, can be used for mismatch characterization via a technique known as backward propagation of variance (BPV). In other approaches, threshold voltage and gain factor mismatch can be used for characterization and/or circuit modeling purposes. Whatever data are used, the test structures for mismatch characterization must be laid out very carefully and the measurements must be done extremely accurately because for precision circuits, mismatches of the order of 0.1% are important (e.g. for a 10 bit data converter, $2^{10}=1024$ so the least significant bit needs to be accurate to order 0.1%).

Because of the need for highly symmetric device layouts and highly precise measurements, mismatch characterization is difficult and has primarily been done in a lab and not a production test environment. This means that mismatch has often not been tracked over time.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein provide a circuit that generates a large, easy to measure output voltage that depends only on mismatch between metal-oxide-semiconductor field-effect transistors (MOSFET) in one inverter stage and transistors in another inverter stage. The circuit can be located in unused portions of a semiconductor wafer, or implemented in one or more integrated circuit dies on the wafer to enable cost-effective, reliable monitoring and control of transistor mismatch during fabrication to increase yield and device reliability.

Figure 1:
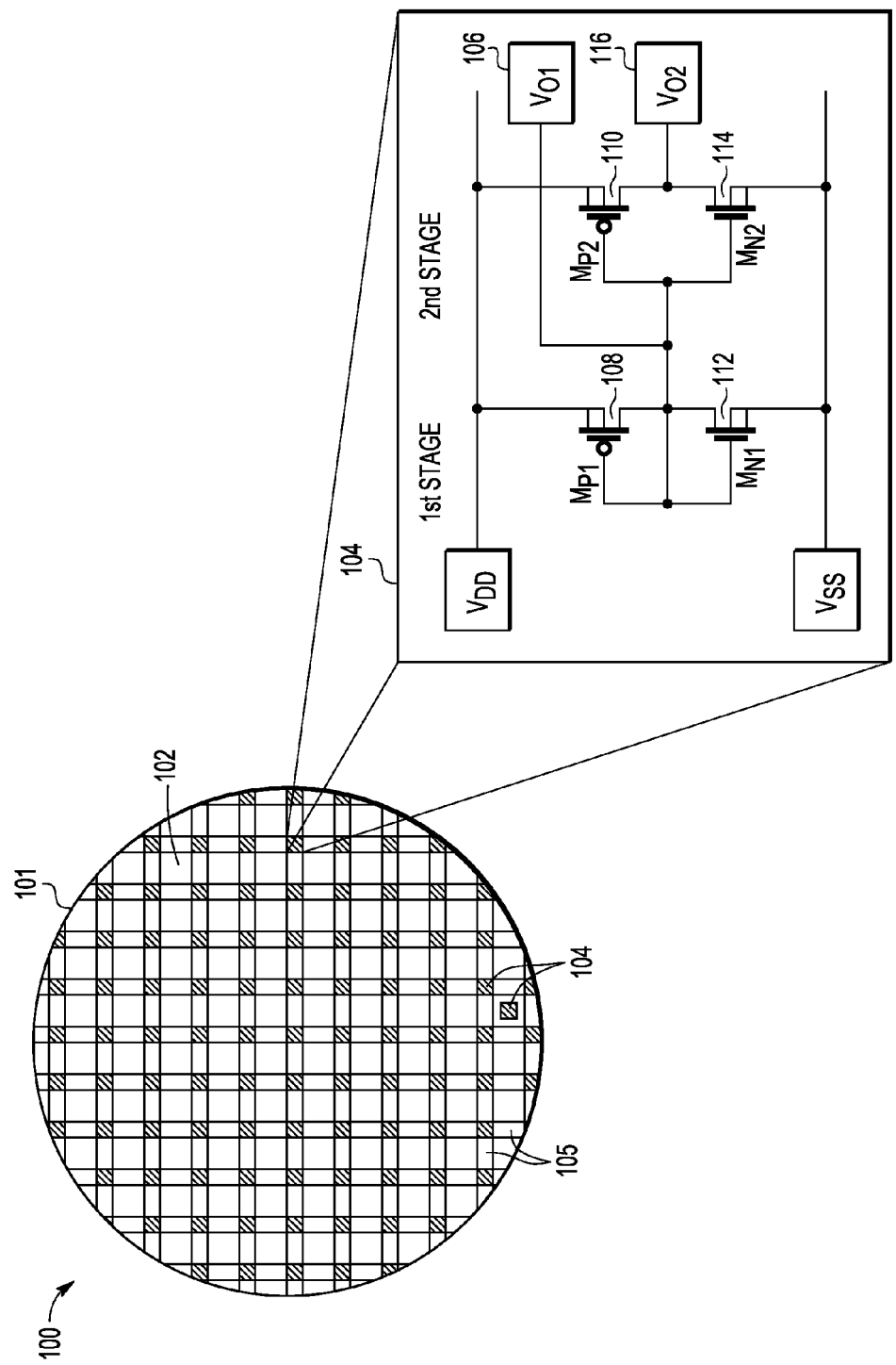
FIG. 1 is a schematic diagram of an embodiment of a semiconductor device including a circuit that can be used to indicate transistor mismatch.

Referring to FIG. 1, a semiconductor device 100 is shown that includes wafer 101 on which a plurality of semiconductor die structures 102 are formed. Transistor mismatch circuits 104 can be formed anywhere along a grid of horizontal and/or vertical scribe streets 105 between the die structures 102 even though circuits 104 are shown at the intersections of horizontal and vertical scribe streets 105. Circuits 104 can also be formed in one or more die structures 102 in addition to or instead of being formed in scribe streets 105.

Circuits 104 can include first P-type metal oxide semiconductor (PMOS) transistor 108, second PMOS transistor 110, first N-type metal oxide semiconductor NMOS transistor 112, and second NMOS transistor 114. Transistors 108, 110, 112, 114 each can have a source electrode, a drain electrode, a gate electrode, and a body electrode. The gate electrodes of first and second PMOS transistors 108, 110 and first and second NMOS transistors 112, 114 are coupled to the drain electrodes of first PMOS transistor 108 and first NMOS transistor 112. The drain electrode of second PMOS transistor 110 is coupled to the drain electrode of second NMOS transistor 114. The first output terminal Vo1 is coupled to the drain electrodes of first PMOS transistor 108 and first NMOS transistor 112. The second output terminal Vo2 is coupled to the drain electrodes of second PMOS transistor 110 and second NMOS transistor 114.

Voltage supply Vdd is coupled to the source and bulk electrodes of first and second PMOS transistors 108, 110. Voltage supply Vss is coupled to the source and bulk electrodes of first and second NMOS transistors 112, 114.

The difference between voltage at first output terminal Vo1 106 and voltage at second output terminal Vo2 116 indicates mismatch between the transistors 108, 110 112, 114. First PMOS and NMOS transistors 108, 112 form a self-biased inverter circuit. Second PMOS and NMOS transistors 110, 114 form a second stage inverter circuit that amplifies transistor mismatch of the self-biased inverter circuit.

The mismatch measurements can be used to characterize transistors on wafer 101 right after wafer 101 is manufactured. Since it is desirable for similar types of transistors on semiconductor device 100 to have the same or similar characteristics, corrective action can be taken in subsequent manufacturing steps to reduce the differences between the transistors on wafers 101 if the mismatch characteristics are not acceptable.

The difference between the voltages at the first and second output terminals 106, 116 is due to mismatch between first and second PMOS transistors 108, 110, and/or first and second NMOS transistors 112, 114.

The geometry of the transistors 108, 110, 112, 114 can be varied to accentuate differences between transistors 108, 110, 112, 114. For example, transistors 108, 110, 112, 114 can be formed with minimum length and width according to design rules for the process technology. In another example, the width of minimum length first and second PMOS transistors 108, 110 can be selected to have current drive capability comparable to first and second NMOS transistors 112, 114. In another example, the length and/or width for NMOS transistors 112, 114 can be formed to be greater than the minimum according to design rules for the process technology and the length for PMOS transistors 108, 110 can be the same as for NMOS transistors 112, 114 while the width for PMOS transistors 108, 110 can be scaled to give current drive comparable to NMOS transistors 112, 114. Alternatively, the minimum length for NMOS transistors 112, 114 can be used in circuit 104 with widths scaled to four or nine times the minimum width, or other suitable scale factor with minimum length for PMOS transistors 108, 110 with widths scaled to have current drive capability comparable to first and second NMOS transistors 112, 114.

Figure 2:
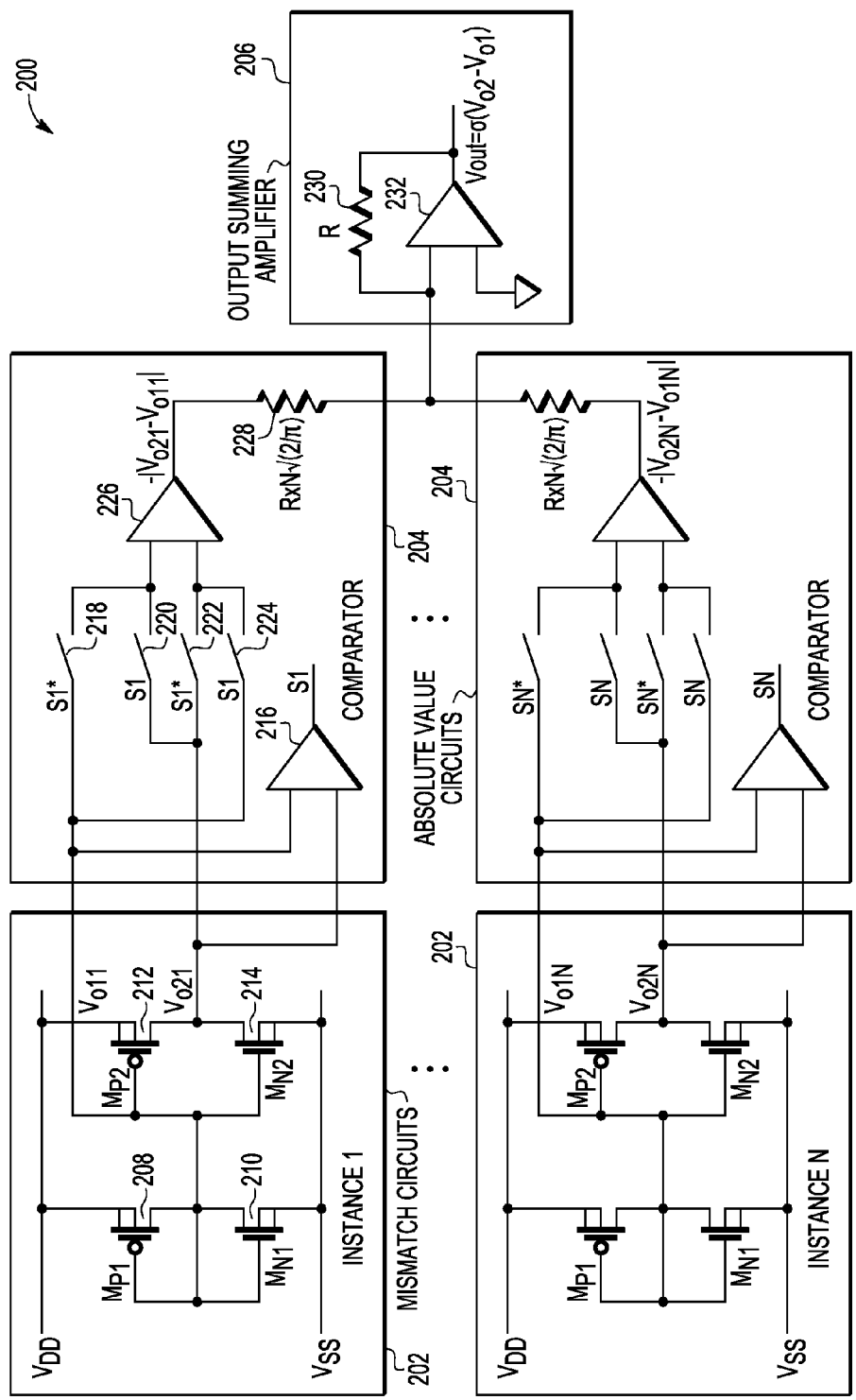
FIG. 2 is a schematic diagram of an embodiment of a circuit that can be used to characterize transistor mismatch in the semiconductor device of FIG. 1.

FIG. 2 is a schematic diagram of an embodiment of a circuit 200 that can be used to characterize transistor mismatch on semiconductor device 100 of FIG. 1 that comprises a plurality of transistor mismatch circuits 202, a plurality of absolute value circuits 204, and a characterization circuit 206 formed on semiconductor wafer 101. Characterization circuit 206 is coupled to receive input provided by a mismatch circuit 202 and absolute value circuit 204 and is configured to output a standard deviation of mismatch between transistors 208/212, 210/214 in a mismatch circuit 202. Transistor mismatch circuit 202 outputs values Vo1 and Vo2 and the difference between these output voltages is indicative of mismatch between PMOS transistors 208/212 and between NMOS transistors 212, 214. Absolute value circuit 204 and characterization circuit 206 receive the output of a mismatch circuit 202 and provides a value indicating the standard deviation of the mismatch between the transistors 208/212, 210/214.

Characterization circuit 206 can be implemented as a summing amplifier that includes operational amplifier 232 coupled in parallel to resistor 230. Resistors 228 are coupled in series between respective transistor mismatch circuits 202 and absolute value circuits 204 and the summing amplifier. Resistor 230 has a value of R ohms and resistors 228 have a value equal to the value of the first resistor times the number of transistor mismatch circuits times the square root of 2 divided by pi ($2/\pi$) to determine the standard deviation of mismatch between transistors 208/212, 210/214 in the mismatch circuits 202. Note that other types of characterization circuits 206 can be implemented on semiconductor device 100 instead of or in addition to a summing amplifier to provide indicators or measurements of characteristics of transistor mismatch other than standard deviation.

Transistor mismatch circuits 202 are similar to transistor mismatch circuits 104 of FIG. 1 and include a first stage inverter circuit with PMOS transistor 208 and NMOS transistor 210. A drain electrode of PMOS transistor 208 is coupled to a drain electrode of NMOS transistor 210. A second stage inverter circuit forming a second stage of mismatch circuit 202 includes PMOS transistor 212 and NMOS transistor 214. A drain electrode of PMOS transistor 212 is coupled to a drain electrode of NMOS transistor 214. A first output voltage Vo1 is coupled between the drain electrodes of first PMOS transistor 208 and first NMOS transistor 210 and to the gate electrodes of PMOS transistors 208, 212 and NMOS transistors 210, 214. A second output voltage Vo2 is coupled between the drain electrodes of second PMOS transistor 212 and second NMOS transistor 214. Source and bulk electrodes of PMOS transistors 208, 212 are coupled to Vdd, and source and bulk electrodes of NMOS transistors 210, 214 are coupled to Vss.

A plurality of absolute value circuits 204 can be coupled between respective transistor mismatch circuits 202 and the characterization circuit 206. In some embodiments, absolute value circuits 204 can include comparator 216 that has a first input coupled to the first output voltage Vo1 of transistor mismatch circuits 202. A second input of each comparator 216 is coupled to a respective second output voltage Vo2 from the transistor mismatch circuit 202. Comparator 216 provides an output (denoted as s1 . . . sN for respective N-number of comparators) that is used to select inputs to respective unity gain buffer 226.

Unity gain buffers 226 are configured to receive first and second inputs, and to provide an output that indicates the absolute value of the difference between the output voltages Vo1 and Vo2 of the respective transistor mismatch circuit 202. The first input of unity gain buffer 226 is coupled to a first set of switches 218, 220 that operate based on the output of comparator 216. Switch 218 closes and switch 220 opens to provide a first output voltage Vo1 to a first input of unity gain buffer 226 when a first output voltage is less than a second output voltage. Switch 218 opens and switch 220 closes to provide a second output voltage Vo2 to the first input of unity gain buffer 226 when a second output voltage is less than a first output voltage.

The second input of unity gain buffer 226 is coupled to a second set of switches 222, 224 that operate based on the output of comparator 216. Switch 222 closes and switch 224 opens to provide a second output voltage Vo2 to the second input of the third comparator when a first output voltage is less than a second output voltage. Switch 222 opens and switch 224 closes to provide a first output voltage Vo1 to the second input of unity gain buffer 226 when a first output voltage is greater than a second output voltage.

Figure 3:
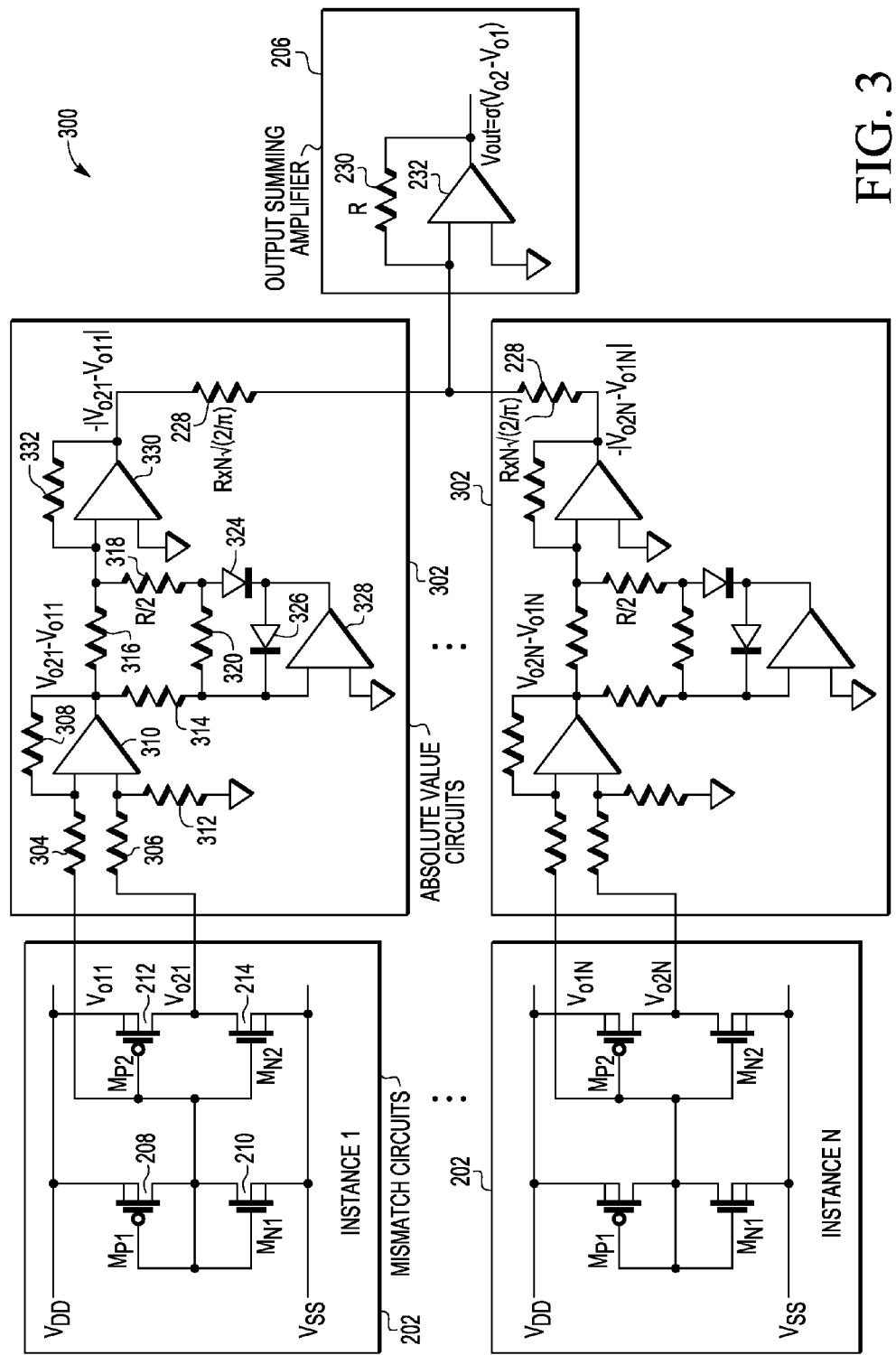
FIG. 3 is a schematic diagram of another embodiment of a circuit that can be used to characterize transistor mismatch in the semiconductor device of FIG. 1.

FIG. 3 is a schematic diagram of another embodiment of a circuit 300 that can be used to characterize transistor mismatch that includes one or more transistor mismatch circuits 202, one or more absolute value circuits 302, and characterization circuit 206 formed on semiconductor wafer 101.

In the embodiment shown, absolute value circuits 302 are coupled between respective transistor mismatch circuits 202 and characterization circuit 206. Absolute value circuits 302 include resistor 304 coupled between a first output voltage Vo1 and a first input of operational amplifier 310. Resistor 306 is coupled between a second output voltage Vo2 and a second input of operational amplifier 310. Resistor 308 is coupled between the first input of operational amplifier 310 and an output of operational amplifier 310. Resistor 312 is coupled between the second input of operational amplifier 310 and ground. Resistor 314 is coupled between the output of operational amplifier 310 and a first input of operational amplifier 328. Resistor 316 is coupled between the output of operational amplifier 310 and a first input of operational amplifier 330. Resistor 318 is coupled between the first input of operational amplifier 330 and a diode 324 and one terminal of a resistor 320. The other terminal of resistor 320 is coupled to the first input of operational amplifier 328. Diode 324 is coupled between one terminal of resistor 318 and the output of operational amplifier 328. Diode 326 is coupled between the output of operational amplifier 328 and the first input of operational amplifier 328. A second input of operational amplifier 328 is coupled to ground. Resistor 332 coupled between the first input of operational amplifier 330 and the output of operational amplifier 330. A second input of operational amplifier 330 is coupled to ground. Characterization circuit 206 is summing amplifier that includes operational amplifier 232 coupled in parallel to resistor 230. The first input of operational amplifier 232 receives output of absolute value circuits 302, connected via resistors 228. The second input of operational amplifier 232 is coupled to ground.

Characterization circuit 206 is configured to output a standard deviation of mismatch between transistors 208/212, 210/214 in the mismatch circuits 202. The transistor mismatch circuits 202 outputs values Vo1 and Vo2 and the difference between these output voltages is indicative of mismatch between PMOS transistors 208/212 and between NMOS transistors 212, 214. Characterization circuit 206 receives the output of mismatch circuits 202 through absolute value circuits 302 and provides a value indicating the standard deviation of the mismatch between the transistors 208/212, 210/214.

Characterization circuit 206 can be implemented as a summing amplifier that includes operational amplifier 232 coupled in parallel to resistor 230. Resistors 228 are coupled in series between respective absolute value circuits 302 and the summing amplifier. Resistor 230 has a value of R ohms and resistors 228 have a value equal to the value of the first resistor times the number of transistor mismatch circuits times the square root of 2 divided by pi ($2/\pi$) to determine the standard deviation of mismatch between transistors 208/212, 210/214 in the mismatch circuits 202. Note that other types of characterization circuits 206 can be implemented on semiconductor device 100 instead of or in addition to a summing amplifier to provide indicators or measurements of characteristics of transistor mismatch other than standard deviation.

Transistor mismatch circuits 202 are similar to transistor mismatch circuits 104 of FIG. 1 and include a first stage inverter circuit with PMOS transistor 208 and NMOS transistor 210. A drain electrode of PMOS transistor 208 is coupled to a drain electrode of NMOS transistor 210. A second stage inverter circuit forming a second stage of mismatch circuit 202 includes PMOS transistor 212 and NMOS transistor 214. A drain electrode of PMOS transistor 212 is coupled to a drain electrode of NMOS transistor 214. A first output voltage Vo1 is coupled between the drain electrodes of first PMOS transistor 208 and first NMOS transistor 210 and to the gate electrodes of PMOS transistors 208, 212 and NMOS transistors 210, 214. A second output voltage Vo2 is coupled between the drain electrode of second PMOS transistor 212 and the drain electrode of the second NMOS transistor 214. Source and bulk electrodes of PMOS transistors 208, 212 are coupled to Vdd, and source and bulk electrodes of NMOS transistors 210, 214 are coupled to Vss.

One or more circuits 200, 300 can be formed with one or more transistor mismatch circuits 104, 202, absolute value circuits 204, 302 and summing amplifier or other characterization circuit 206 in various locations in scribe streets 105 and/or in IC die 102 on semiconductor wafer 101 (FIG. 1).

Once wafer 101 is processed, supply voltages Vdd and Vss can be applied to the plurality of transistor mismatch circuits 104, 202 simultaneously during probe testing. Output of the characterization circuit 206 can be measured with another probe while the supply voltages are applied to the transistor mismatch circuits 104, 202.

Because the apparatus implementing the present disclosure is, apart from transistor mismatch circuits 104, 202, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the disclosure has been described with respect to specific conductivity types or polarity of potentials, skilled artisans appreciate that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, the circuits described herein can be implemented using any type of MOS transistor, such as standard bulk transistors, silicon on insulator transistors (with or without a body contact), and multi-gate FinFET structures, to name a few. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a summing amplifier;
   a plurality of transistor mismatch circuits, wherein the transistor mismatch circuits output a value indicative of mismatch between transistors in a respective one of the transistor mismatch circuits; and
   first output voltages Vo1 and second output voltages Vo2 from each of the transistor mismatch circuits coupled simultaneously to an input of the summing amplifier, wherein the summing amplifier provides a value indicating a standard deviation of the mismatch between the transistors in the plurality of mismatch circuits simultaneously with the first and second output voltages of the plurality of transistor mismatch circuits being applied to the summing amplifier.

2. The semiconductor device of claim 1 further comprising:
   the summing amplifier includes a first operational amplifier coupled in parallel to a first resistor; and a plurality of second resistors coupled in series between respective transistor mismatch circuits and the summing amplifier.

3. The semiconductor device of claim 2 further comprising:
the first resistor has a value of R ohms; and
the second resistors have a value equal to the value of the first resistor times the number of transistor mismatch circuits times the square root of 2 divided by pi ($\sqrt{(2/\pi)}$)).

4. The semiconductor device of claim 1, wherein the transistor mismatch circuits comprise:
a first inverter circuit including a first PMOS transistor and a first NMOS transistor, a drain electrode of the first PMOS transistor coupled to a drain electrode of the first NMOS transistor;
a second inverter circuit including a second PMOS transistor and a second NMOS transistor, a drain electrode of the second PMOS transistor coupled to a drain electrode of the second NMOS transistor;
one of the first output voltages Vo1 coupled to gate electrodes of the first and second PMOS and NMOS transistors, and between the drain electrode of the first PMOS transistor and the drain electrode of the first NMOS transistor to self-bias the first inverter circuit; and
one of the second output voltages Vo2 coupled between the drain electrode of the second PMOS transistor and the drain electrode of the second NMOS transistor.

5. The semiconductor device of claim 1 further comprising:
a plurality of absolute value circuits coupled between respective transistor mismatch circuits and the summing amplifier.

6. The semiconductor device of claim 5, wherein the absolute value circuits include
a comparator that has
a first input coupled to a respective first output voltage Vo1 of one of the transistor mismatch circuits,
a second input coupled to a respective second output voltage Vo2 from one of the transistor mismatch circuits, and
an output that is used to select inputs to a unity gain buffer; and
a unity gain buffer configured to receive a first input and a second input, and to provide the unity gain buffer output indicating the absolute value of the difference between the second output voltage and the first output voltage of the respective transistor mismatch circuit,
the first input of the unity gain buffer is coupled to a first set of switches that operate based on the output of the comparator to provide the first output voltage to the first input of the unity gain buffer when the first output voltage is less than the second output voltage, and to provide the second output voltage to the first input of the unity gain buffer when the second output voltage is less than the first output voltage, and
the second input of the unity gain buffer is coupled to a second set of switches that operate based on the output of the comparator to provide the first output voltage to the second input of the unity gain buffer when the first output voltage is greater than the second output voltage, and to provide the second output voltage to the second input of the unity gain buffer when the second output voltage is greater than the first output voltage.

7. The semiconductor device of claim 5 wherein the absolute value circuits further include:

a second resistor coupled between the first output voltage Vo1 and a first input of a second operational amplifier;
a third resistor coupled between the second output voltage Vo2 and a second input of the second operational amplifier;
a fourth resistor coupled between the first input of the second operational amplifier and an output of the second operational amplifier;
a fifth resistor coupled between the second input of the second operational amplifier and ground;
a sixth resistor coupled between the output of the second operational amplifier and a first input of a third operational amplifier;
a seventh resistor coupled between the output of the second operational amplifier and a first input of a fourth operational amplifier;
an eighth resistor coupled between the first input of the fourth operational amplifier and a diode;
a ninth resistor including one terminal coupled between the eighth resistor and diode, another terminal coupled to one input of the third operational amplifier;
a first diode coupled between the output of the third operational amplifier and the eighth resistor;
a second diode coupled between the first input of the third operational amplifier and the output of the third operational amplifier;
a second input of the third operational amplifier is coupled to ground;
a tenth resistor coupled between the first input of the fourth operational amplifier and the output of the fourth operational amplifier; and
a second input of the fourth operational amplifier is coupled to ground.

8. The semiconductor device of claim 5 wherein the summing amplifier 206 includes a first operational amplifier with a resistor coupled between an output of the first operational amplifier and a first input of the first operational amplifier and with a second input of the first operational amplifier coupled to ground.

9. A method comprising:
forming a plurality of transistor mismatch circuits on a semiconductor wafer;
forming a summing amplifier on the wafer, wherein the summing amplifier is electrically coupled to receive first and second output voltages from each of the plurality of mismatch circuits simultaneously;
simultaneously applying supply voltages Vss and Vdd to the plurality of transistor mismatch circuits during probe testing; and
measuring an output of the summing amplifier while the supply voltages are simultaneously applied to the plurality of the transistor mismatch circuits and the first and second output voltages from each of the plurality of mismatch circuits are simultaneously applied to the summing amplifier on the wafer, wherein the output of the summing amplifier indicates a standard deviation of the mismatch between the transistors in the plurality of mismatch circuits.

10. The method of claim 9 further comprising:
forming a plurality of absolute value circuits coupled between the transistor mismatch circuits and the summing amplifier.

11. The method of claim 9 wherein the output of the summing amplifier represents a characteristic of mismatch between similar types of transistors on the semiconductor wafer.

12. The method of claim 11 wherein the mismatch circuits include a first self-biasing inverter circuit having a first PMOS transistor coupled to a first NMOS transistor, and a second inverter circuit having a second PMOS transistor couple to a second NMOS transistor, and the characteristic of mismatch is standard deviation of mismatch between similar types of the transistors.

13. The method of claim 9 wherein the mismatch circuits are formed in at least one of: a scribe street on the wafer, and in an integrated circuit die on the wafer.

14. A semiconductor device comprising:
a plurality of transistor mismatch circuits formed on a semiconductor wafer; and
a characterization circuit formed on the semiconductor wafer, the characterization circuit is coupled to receive first and second output voltages provided by each of the mismatch circuits simultaneously and is configured to output a standard deviation of mismatch between transistors in the plurality of mismatch circuits simultaneously with receiving the first and second output voltages provided by each of the mismatch circuits simultaneously.

15. The semiconductor device of claim 14 further comprising:
a plurality of absolute value circuits coupled between respective transistor mismatch circuits and the characterization circuit, wherein the absolute value circuits are configured to receive input from the transistor mismatch circuits and to output an absolute value of the input.

16. The semiconductor device of claim 14, the mismatch circuits comprising:
a first PMOS transistor and a first NMOS transistor configured as a first stage inverter circuit; and
a second PMOS transistor and a second NMOS transistor configured as a second stage inverter circuit that is coupled to the first inverter circuit.

17. The semiconductor device of claim 15 further comprising:
a plurality of resistors, wherein each of the resistors is coupled between the output of a respective one of the absolute value circuits and the characterization circuit, and the value of the resistors is proportional to the number of mismatch circuits.

18. The semiconductor device of claim 17 wherein the characterization circuit is a summing amplifier that includes a first operational amplifier with a resistor coupled between an output of the first operational amplifier and a first input and a second input coupled to ground.

19. The semiconductor device of claim 14 wherein the transistor mismatch circuits comprise:
a first inverter circuit including a first PMOS transistor and a first NMOS transistor, a drain electrode of the first PMOS transistor coupled to a drain electrode of the first NMOS transistor;
a second inverter circuit including a second PMOS transistor and a second NMOS transistor, a drain electrode of the second PMOS transistor coupled to a drain electrode of the second NMOS transistor;
one of the first output voltages coupled to gate electrodes of the first and second PMOS and NMOS transistors, and between the drain electrode of the first PMOS transistor 208 and the drain electrode of the first NMOS transistor to self-bias the first inverter circuit; and
one of the second output voltages coupled between the drain electrode of the second PMOS transistor and the drain electrode of the second NMOS transistor.

20. The semiconductor device of claim 14 wherein the mismatch circuits are formed in at least one of: a scribe street on the wafer, and in an integrated circuit die on the wafer.

* * * * *